United States Patent
Abbink et al.

(10) Patent No.: US 8,552,725 B2
(45) Date of Patent: Oct. 8, 2013

(54) SYSTEMS AND METHODS FOR OBSTRUCTING MAGNETIC FLUX WHILE SHIELDING A PROTECTED VOLUME

(75) Inventors: Henry C. Abbink, Westlake Village, CA (US); Edward Kanegsberg, Pacific Palisades, CA (US)

(73) Assignee: Northrop Grumman Guidance & Electronics Company, Inc., Woodland Hills, CA (US)

( * ) Notice: Subject to any disclaimer, the term of this patent is extended or adjusted under 35 U.S.C. 154(b) by 944 days.

(21) Appl. No.: 12/632,208

(22) Filed: Dec. 7, 2009

(65) Prior Publication Data

US 2011/0133738 A1 Jun. 9, 2011

(51) Int. Cl.
G01C 19/60 (2006.01)
G01R 33/20 (2006.01)

(52) U.S. Cl.
USPC .............. 324/318; 324/321; 206/719

(58) Field of Classification Search
USPC .......... 324/300–322; 257/659, 660, 704, 710; 600/410, 411; 206/719; 174/255, 363, 174/377, 386, 521; 315/85; 335/216, 299; 428/74
See application file for complete search history.

(56) References Cited

U.S. PATENT DOCUMENTS

| | | | |
|---|---|---|---|
| 4,157,495 A | 6/1979 | Grover et al. | |
| 4,461,996 A | 7/1984 | Kwon | |
| 4,525,672 A | 6/1985 | Lam et al. | |
| 5,399,939 A * | 3/1995 | Greenberg et al. | 315/85 |
| 5,642,087 A * | 6/1997 | Crow | 335/216 |
| 5,717,371 A * | 2/1998 | Crow | 335/216 |
| 5,748,063 A * | 5/1998 | Crow | 335/299 |
| 5,939,772 A * | 8/1999 | Hurst et al. | 257/659 |
| 6,259,849 B1 | 7/2001 | McLean et al. | |
| 6,350,951 B1 * | 2/2002 | Askew | 174/521 |
| 6,462,824 B1 | 10/2002 | McLean et al. | |
| 6,566,596 B1 * | 5/2003 | Askew | 257/659 |
| 6,590,391 B1 * | 7/2003 | Shudo et al. | 324/318 |
| 7,501,826 B2 * | 3/2009 | Eberler et al. | 324/322 |
| 7,550,679 B1 * | 6/2009 | Wershoven | 174/377 |
| 7,772,848 B2 * | 8/2010 | Staats et al. | 324/318 |
| 8,253,039 B2 * | 8/2012 | Nielsen | 174/386 |
| 2006/0139029 A1 | 6/2006 | Abbink et al. | |
| 2008/0011511 A1 * | 1/2008 | Niino | 174/363 |
| 2008/0054901 A1 * | 3/2008 | Eberler et al. | 324/318 |
| 2009/0029094 A1 * | 1/2009 | Sano et al. | 428/74 |
| 2009/0084586 A1 * | 4/2009 | Nielsen | 174/255 |
| 2011/0133738 A1 * | 6/2011 | Abbink et al. | 324/318 |

FOREIGN PATENT DOCUMENTS

EP 1 048 930 A2 11/2000

* cited by examiner

*Primary Examiner* — Melissa Koval
*Assistant Examiner* — Tiffany Fetzner
(74) *Attorney, Agent, or Firm* — Tarolli, Sundheim, Covell & Tummino LLP

(57) ABSTRACT

An aspect of the present invention relates to system and method for substantially obstructing magnetic flux. One aspect of the present invention provides an apparatus for substantially obstructing at least one magnetic flux path between an ambient space and a protected volume. The apparatus includes an inner shield, substantially enclosing the protected volume. The inner shield has at least one inner shield aperture extending therethrough to allow external access to the protected volume. An outer shield substantially encloses the inner shield. The outer shield has at least one outer shield aperture extending therethrough to allow internal access from the ambient space. The apparatus is configured to impede magnetic flux between at least one inner shield aperture and at least one outer shield aperture.

30 Claims, 2 Drawing Sheets

SYSTEMS AND METHODS FOR OBSTRUCTING MAGNETIC FLUX WHILE SHIELDING A PROTECTED VOLUME

TECHNICAL FIELD

The present invention relates to systems and methods for obstructing magnetic flux and, more particularly, to systems and methods for substantially obstructing at least one magnetic flux path between an ambient space and a protected volume.

BACKGROUND

For navigation grade nuclear magnetic resonance ("NMR") gyroscopes, a shielding attenuation factor of less than $1 \times 10^5$ is desired because the uncertainty in the gyroscope axis alignment for a navigation grade gyroscope must be less than about one arc-second. Using a conventional method, external fields aligned along the internal magnetic field vector can be compensated. However, an external magnetic field with a component orthogonal to the spin axis will result in a change in direction of the internal magnetic field vector, which is an axis misalignment. The range of attenuation factor that is required to keep the axis alignment error less than one arc-second depends upon the maximum external magnetic field expected to be encountered and the magnitude of the internal magnetic field. The shielding should be sufficient to keep the orthogonal external field penetrating the shield at less than five parts per million of the applied internal field.

Simple calculations show that at least two layers of magnetic shielding will be required. However, it may be difficult to provide multiple robust shielding layers for very small (down to one cc volume) NMR gyroscopes, such as those used in inertial measurement units ("IMUs"). At this diminutive size, it may be difficult to provide robust shielding, considering the multiple electrical and mechanical connections needed for NMR gyroscope operation.

As a further complicating factor, NMR gyroscopes are generally not used singly, but are commonly used in an orthogonal arrangement of three gyroscopes. This triple-gyroscope configuration is desirable because when the true axis of rotation is not along the spin axis, the NMR gyroscope does not measure the component of rate about the spin axis in a conventional manner. Instead, corrections must be applied based upon the output of all three individual NMR gyroscopes. Therefore, the shielding requirements are complicated because of the necessity of maintaining an operable yet small package of multiple gyroscopes.

An example of an appropriate means for preventing magnetic interference with the NMR gyroscope is a two-layer shielding structure. In this two-layer structure, both the inner and outer shields may be formed of a high magnetic permeability material, which is subjected to a stress annealing process to enhance and maximize its magnetic permeability. Such shields are often made of a ferromagnetic material having high relative magnetic permeability. When the magnetic permeability of a shielding material is high, the magnetic flux paths are substantially diverted through the structure of the shield and do not reach the contents being shielded. Commonly used high permeability materials include alloys, such as Carpenter High Permeability 49® and/or Carpenter HyMu 80® (trademarks of Carpenter Technology Corporation of Reading, Pa.), whose compositions are respectively a 48% nickel-iron alloy and an unoriented 80% nickel-iron-molybdenum alloy.

SUMMARY

The present invention relates to systems and methods for substantially obstructing magnetic flux. One aspect of the present invention provides an apparatus for substantially obstructing at least one magnetic flux path between an ambient space and a protected volume. The apparatus includes an inner shield, substantially enclosing the protected volume. The inner shield has at least one inner shield aperture extending therethrough to allow external access to the protected volume. An outer shield substantially encloses the inner shield. The outer shield has at least one outer shield aperture extending therethrough to allow internal access from the ambient space. The apparatus is configured to impede magnetic flux between at least one inner shield aperture and at least one outer shield aperture.

Another aspect of the present invention provides an apparatus for substantially obstructing at least one magnetic flux path between an ambient space and a protected volume. The apparatus includes an inner shield, substantially enclosing the protected volume. An outer shield substantially encloses the inner shield. A wiring board is located adjacent to and outside at least one of the inner and outer shielding means. The wiring board is configured to provide an electrical connection to the protected volume while impeding magnetic flux between the ambient space and the protected volume.

Yet another aspect of the present invention provides a method of substantially obstructing at least one magnetic flux path between an ambient space and a protected volume. The protected volume is substantially enclosed within an inner shield. The inner shield has at least one inner shield aperture extending therethrough to allow external access to the protected volume. The inner shield is substantially enclosed within an outer shield. The outer shield has at least one outer shield aperture extending therethrough to allow internal access from the ambient space. Magnetic flux between at least one inner shield aperture and at least one outer shield aperture is impeded.

Yet another aspect of the present invention provides a system for substantially obstructing at least one magnetic flux path between an ambient space and a protected volume. The system includes an inner shielding means substantially enclosing the protected volume. The inner shielding means has at least one inner shield aperture extending therethrough to allow external access to the protected volume. An outer shielding means substantially encloses the inner shielding means. The outer shielding means has at least one outer shield aperture extending therethrough to allow internal access from the ambient space. Obstruction means impedes magnetic flux between at least one inner shield aperture and at least one outer shield aperture.

DETAILED DESCRIPTION

Figure 1:
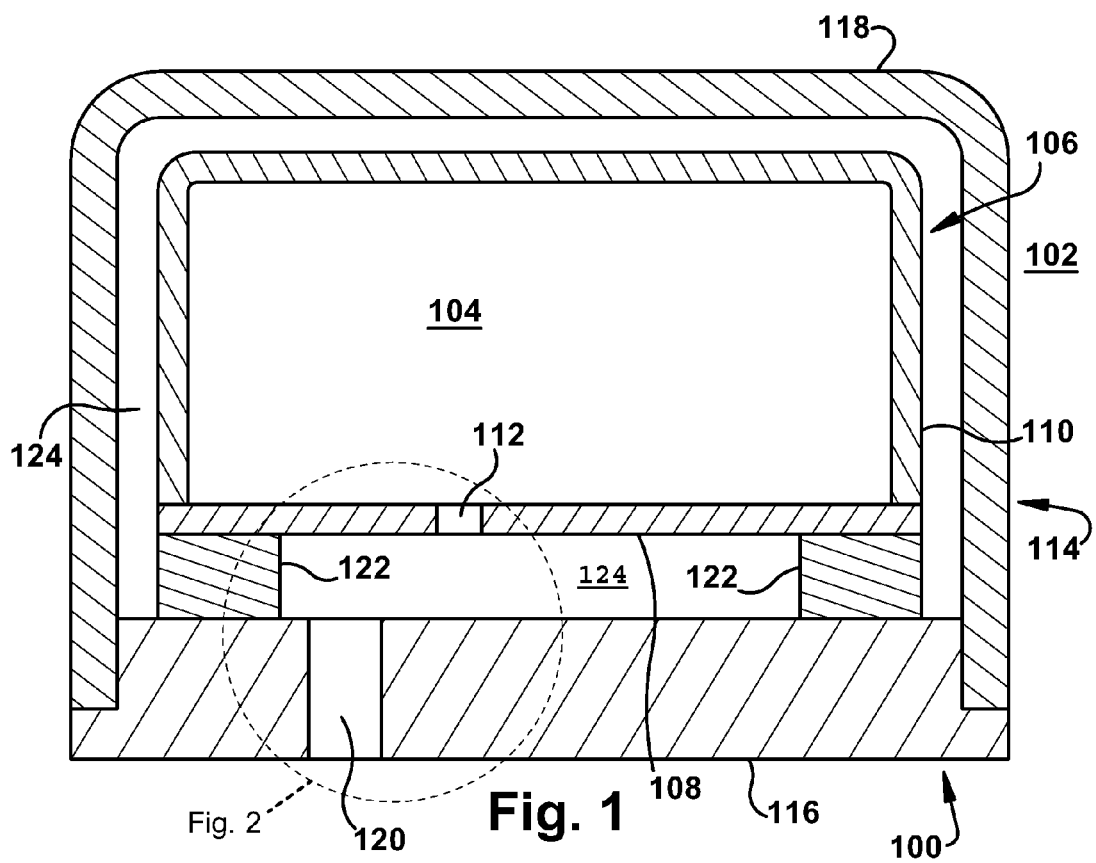
FIG. 1 depicts a cross-sectional side view of an apparatus in accordance with a first embodiment of the present invention.

FIG. 1 depicts an apparatus 100 for substantially obstructing at least one magnetic flux path between an ambient space 102 and a protected volume 104, according to a first embodiment of the present invention. Herein, the term "obstructing" will be used to indicate that a magnetic flux path is blocked from reaching an area/volume to be protected, even though the magnetic flux paths are actually being diverted or redirected into a desired path through the shielding materials, rather than being repelled in some manner. The term "impeding" may be used similarly, to indicate that a magnetic flux path is diverted away from an area/volume to be protected. The protected volume 104 may contain a magnetic field-sensitive instrument, such as an NMR gyroscope, or any other desired contents, but is shown empty in the Figures for clarity of depiction.

An inner shield 106 substantially encloses the protected volume 104. The inner shield 106 may be made of multiple components, for ease of assembly, and the inner shield shown in FIG. 1 includes an inner base 108 connected to an inner cover 110. The inner base 108 may be wholly or partly formed of a high-magnetic-permeability material such as HyMu 80® (an unoriented 80% nickel-iron-molybdenum alloy available from Carpenter Technology Corporation of Reading, Pa.), a nickel-iron-molybdenum alloy, or any other suitable material, and may be assembled in any desired manner, such as, but not limited to, spin or laser welding. The protected volume 104 may be placed under vacuum, or can be filled with any suitable material, which is preferably nonmagnetic, as desired. When a vacuum is pulled on the protected volume 104, the inner shield 106 may be hermetically sealed and/or may include a vacuum fitting (not shown) for evacuation of the protected volume. It is also contemplated that at least a portion of the inner shield 106, such as the inner base 108 or a portion thereof, may be configured as a printed wiring board ("PWB") or otherwise be configured to provide a specialized function to the apparatus 100 in addition to helping enclose the protected volume 104.

The inner shield 106 has at least one inner shield aperture 112 extending therethrough to allow external access to the protected volume. In FIG. 1, one inner shield aperture 112, which extends through the inner base 108, is depicted, but any number of inner shield apertures having any suitable placement, shape, size, cross-sectional area, filling, or any other characteristics may be provided by one of ordinary skill in the art for a particular application of the present application.

An outer shield 114 substantially encloses the inner shield 106. The outer shield 114 may be made of multiple components, for ease of assembly, and the outer shield shown in FIG. 1 includes an outer base 116 connected to an outer cover 118. The outer base 116 may be wholly or partly formed of a high-magnetic-permeability material such as HyMu 80®, another nickel-iron-molybdenum alloy, or any other suitable material, and may be assembled in any desired manner, such as, but not limited to, spin or laser welding. The assembly method may be chosen to maximize the shielding properties of the finished assembly. It is also contemplated that at least a portion of the outer shield 114, such as the outer base 116 or a portion thereof, may be configured as a PWB or otherwise be operative to provide a specialized function to the apparatus 100 in addition to helping enclose the inner shield 106.

It is contemplated that a second outer shield (not shown), which may share any desired characteristics with the inner and/or outer shields 106 and 114, may substantially enclose the outer shield 106. In fact, any number of substantially concentric inner and outer shields 106 and 114 may be provided to wrap the protected volume 104 with as many layers of shielding material as desired.

The outer shield 114 has at least one outer shield aperture 120 extending therethrough to allow external access to the protected volume. In FIG. 1, one outer shield aperture 120, which extends through the outer base 116, is depicted, but any number of outer shield apertures having any suitable placement, shape, size, cross-sectional area, filling, or any other characteristics may be provided by one of ordinary skill in the art for a particular application of the present application. The outer shield aperture(s) 120 and inner shield aperture(s) 112 should be offset from one another, as shown in FIG. 1, to prevent magnetic flux therebetween and provide additional shielding options for some embodiments of the present invention.

One or more mounting blocks 122 (two shown) may be provided to provide spatial separation between at least a portion of the inner shield 106 and a portion of the outer shield 114. The mounting blocks 122 may be made of any suitable material and in any suitable configuration, but should be magnetically inert. For example, the mounting blocks 122 shown may each be a segment of an aluminum ring. The mounting blocks 122 may be resilient when physical cushioning of the inner shield 106 within the outer shield 114 is desired, or may be electrically, in addition to magnetically, inert (for example, but not limited to, being made from rubber, aluminum, or the like or another nonmagnetic and/or nonconductive material) when magnetic or electrical insulation of the inner shield from the outer shield is desired. While the inner and outer shields 106 and 114 should not be in direct contact with each other, the efficiency of the shielding property of the apparatus 100 varies directly with the distance between the inner shield and the outer shield and can be adjusted as desired by one of ordinary skill in the art for a particular application of the present invention. The outer shield 114 may fit relatively closely around the inner shield 106, or at least a portion of the inner and outer shields may be spaced apart by an intermediate volume 124 located therebetween. The intermediate volume 124 may be placed under vacuum, or can be filled with any suitable material, which is preferably nonmagnetic, to assist with isolating the inner shield 106 from the outer shield 114. When a vacuum is pulled on the intermediate volume 124, one or both of the inner and outer shields 106 and 114 may be hermetically sealed and/or may include a vacuum fitting (not shown) for evacuation of the intermediate volume. Optionally, the intermediate volume 124 substantially surrounds the inner shield 114 (although the intermediate volume can be interrupted by one or more mounting blocks 122, brackets, or the like, to space the inner and outer shields as desired), and the outer shield 114 substantially surrounds the intermediate volume.

Figure 2:
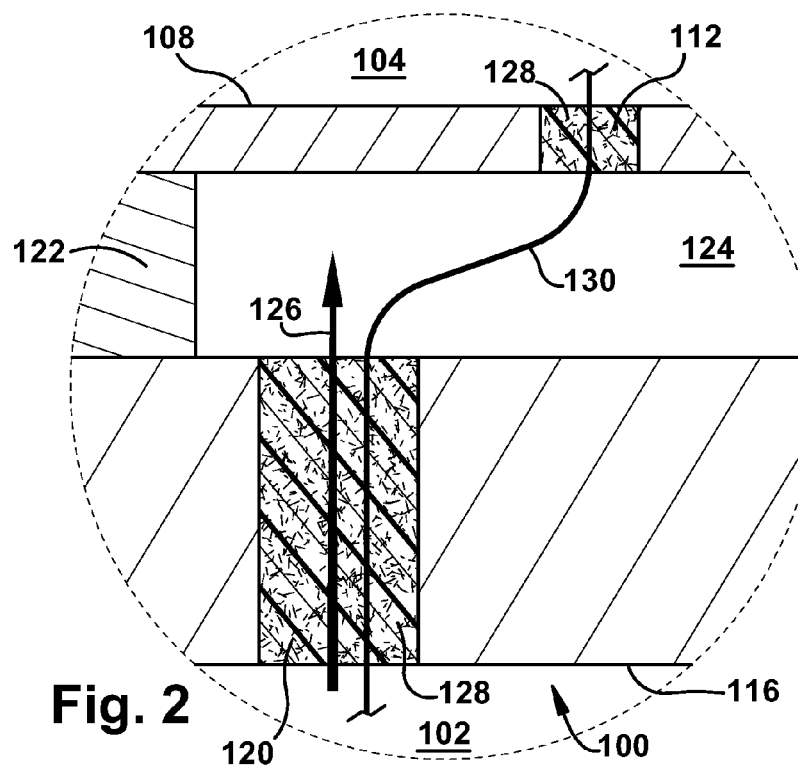
FIG. 2 depicts a partial cross-sectional side view detail taken of area "2" of FIG. 1.

FIG. 2 is a partial cross-sectional side view detail taken of area "2" of FIG. 1. Magnetic flux arrow 126 represents an example magnetic flux path through the outer shield aperture 120. Because the inner shield aperture 112 is offset from the outer shield aperture 120, the magnetic flux reaching the protected volume 104 is substantially reduced in comparison to an unprotected volume (not shown). The inner and outer shield apertures 112 and 120 can be offset in any direction and by any non-zero amount, but the offset should be chosen to avoid giving likely magnetic flux paths a line of sight through the outer shield aperture to the inner shield aperture. In this manner, the configuration and placement of the inner and outer shield apertures 112 and 120 substantially obstruct the magnetic flux path between the ambient space 102 and the protected volume 104. As with the inner/outer shield spacing discussed previously, the efficiency of shielding also varies directly with the amount of offset between the inner and outer shield apertures 112 and 120.

In addition to, or instead of, the offset inner and outer shield apertures 112 and 120, a nonmagnetic material 128, such as, but not limited to, glass and/or plastic, may be located within at least one of the inner and outer shield apertures. As shown in FIG. 2, a connection wire 130 may pass through one or both of the inner and outer shield apertures 112 and 120, to provide an electrical connection through the apparatus 100. When the connection wire 130 extends through both of the inner and outer shield apertures 112 and 120, the connection wire may be jogged before or during installation to provide the desired electrical connection(s). In this manner, an NMR gyroscope (not shown) or other equipment within the protected volume 104 may be electrically connected to the ambient space 102, for example, for transmission of signals and/or power to/from the NMR gyroscope. The connection wire 130, whether or not jogged, may be at least partially held in place by the nonmagnetic and/or electrically insulating material 128. In such case, the thickness, size, shape, or any other characteristics of the inner and/or outer shield bases 108 and 116 may be chosen to mechanically support the connection wire 130 and/or nonmagnetic material 128 within the inner and outer shield apertures 112 and 120.

Figure 3:
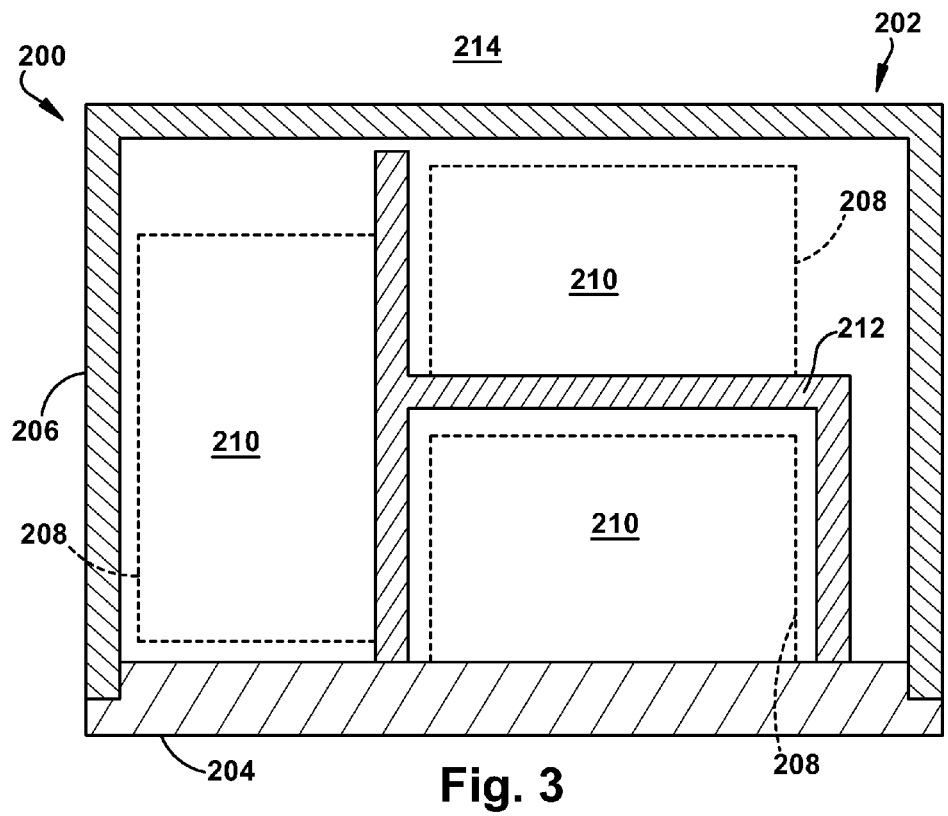
FIG. 3 depicts a cross-sectional side view of an apparatus in accordance with a second embodiment of the present invention.

FIG. 3 depicts an apparatus 200 according to a second embodiment of the present invention. Description of common elements and operation similar to those in the previously described first embodiment will not be repeated with respect to the second embodiment. An outer shield 202 includes an outer base 204 and an outer cover 206. A plurality of inner shields 208 each substantially enclose a protected subvolume 210, which collectively form the protected volume of the second embodiment. The outer shield 202 substantially encloses the plurality of inner shields 208. The embodiment of FIG. 3 could be useful, for example, when three NMR gyroscopes are provided and arranged orthogonally within the outer shield 202.

An inner frame 212 is located within the outer shield 202 and provides support for one or more of the inner shields 208. As shown in FIG. 3, the inner frame 212 can hold two of the three inner shields 208 in an orthogonal relationship with the remaining inner shield 208. The inner frame 212 may form a portion of one or more inner shields 208. It should be noted that the inner shields 208 of FIG. 3 may each individually resemble the apparatus 100 of the first embodiment and have inner and outer shields of their own (not shown), which would make the outer shield 202 of FIG. 3 an additional outer shield, in relation to the protected subvolumes 210. The inner frame 212 may be wholly or partly formed of a high-magnetic-permeability material such as HyMu 80® (an unoriented 80% nickel-iron-molybdenum alloy available from Carpenter Technology Corporation of Reading, Pa.), a nickel-iron-molybdenum alloy, or any other suitable material, and may be assembled in any desired manner, such as, but not limited to, spin or laser welding.

As with the first embodiment, the outer and inner shields 202 and 208 can be formed of any suitable high permeability magnetic shielding materials and in any suitable manner. Likewise, though omitted from FIG. 3 for clarity, one or more inner or outer shield apertures may be provided, and offset and/or filled as desired, to assist with the substantial obstruction of at least one magnetic flux path between an ambient space 214 and one or more of the protected subvolumes 210.

In either of the first or second embodiments, or in any other embodiment of the present invention, a wiring board 300 (such as, but not limited to, the aforementioned PWB) may form a portion of at least one of the inner and outer shields (here shown as a portion of the outer shield 306). A side view detail showing one example arrangement of such a wiring board 300 is shown schematically in FIG. 4. The wiring board 300 may be configured to provide an electrical connection to the protected volume 304, similar and/or in addition to that provided by the connection wire 130 in the apparatus 100 of the first embodiment.

Figure 4:
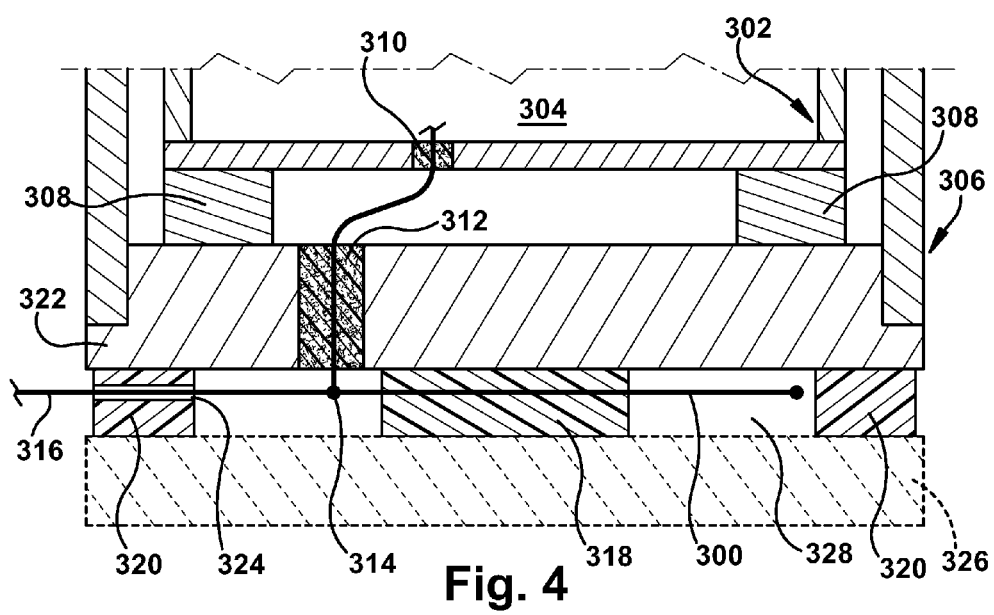
FIG. 4 depicts a partial cross-sectional side view detail of an example component which could be used with any embodiment of the present invention.

Referring to FIG. 4, the wiring board 300 shown may be of a type known as a "flexprint" or flexible circuit and having a plurality of conducting traces upon a bendable substrate, or may be of any other suitable type, such as, but not limited to, a traditional rigid circuit board. The wiring board 300 is shown from the side in FIG. 4 and therefore appears linear, but is actually substantially planar and may have any desired size, shape, material properties, conductive pattern, or any other characteristics. In FIG. 4, a partial view of an apparatus similar to that of the FIG. 1 embodiment is shown, but the arrangement shown may be used with an apparatus similar to that of the FIG. 3 embodiment or with any inner, outer, or intermediate shielding surface (not shown) of any other suitable apparatus. An inner shield 302 substantially encloses a protected volume 304 and is supported in spaced relation to an outer shield 306 by one or more mounting blocks 308. The inner and outer shields 302 and 306 have offset inner and outer shield apertures 310 and 312, respectively, at least one of which may contain nonmagnetic and/or electrically non-conducting material in the manner previously described with reference to FIG. 1. A connection wire 314 extends from the protected volume 304 through the inner and outer shield apertures 310 and 312 and is connected to the wiring board 300 at junction 314. A signal can thereby be carried from the protected volume 304, through the inner and outer shields 302 and 306, along a predetermined conductive path (not shown) of the wiring board 300, and onto a protruding tongue 316 of the wiring board 300 for provision to an outside circuit (not shown) in a known manner.

The wiring board 300 is shown as being located outside and adjacent to the outer shield 306 and may be connected to the outer shield 306 in any way, such as via one or more board mounts (one shown at 318). A ring 320 (shown in cross-sectional view in FIG. 4) or other structure attached to a periphery of the outer base 322 may be used to help provide mounting and/or magnetic isolation for the protected volume 304. A side aperture 324 may be provided in the ring 320 to allow the tongue 316 to protrude from the ring for connection of the wiring board 300 to the outside circuit. The side aperture 324 may be located in an offset and/or spaced-apart relationship from the inner and outer shield apertures 310 and 312, as shown, to further obstruct magnetic flux to the protected volume 304. Alternately, the wiring board 300 may be located adjacent to and outside the inner shield 302 (not shown); one of ordinary skill in the art can readily provide a suitable arrangement accordingly.

Optionally, and as shown in dashed line in FIG. 4, an auxiliary layer 326 may be provided to form a wiring space 328 in cooperation with the ring 320 and outer base 322. For example, if the wiring board 300 of FIG. 4 is being used with the embodiment of FIG. 3, the auxiliary layer 326 may be one or more of the outer base 204 or the inner frame 212. As another example, if the wiring board 300 of FIG. 4 is being used with the embodiment of FIGS. 1-2, the auxiliary layer 326 may be the outer base 116 or may be an additional layer, as shown in FIG. 4. Regardless of the nature of the auxiliary layer 326, though, the wiring space 328 (when present) may substantially enclose the wiring board 300, except for the tongue 316. In this manner, the wiring board 300 can be protected from environmental hazards and the magnetic shielding of the protected volume 304 can be enhanced. The auxiliary layer 326 may comprise the ring 320 or another mounting/spacing feature, and thus attach directly to the outer base 322. The auxiliary layer 326 may supplement or replace the outer base 322 of FIG. 4, if desired.

If the auxiliary layer 326 and the ring 320 are both made of high permeability magnetic material, then the wiring space 328 becomes a secondary protected volume with a small aperture, the side aperture 324. Depending upon the configuration of their relative structures, the side aperture 324 may be located a substantial distance from outer shield aperture 312. This arrangement, when present, greatly reduces magnetic flux entering the outer shield aperture 312 and may enhance magnetic shielding of the protected volume 304.

The manufacturing steps for an apparatus according to the present invention will vary greatly, depending upon the embodiment being manufactured, the contents to be placed in the protected volume, the connections (electrical, magnetic, mechanical, or other) needing to be made, and the like. As an example, for manufacture of an apparatus 100 according to the first embodiment (of FIGS. 1-2), the inner base 108 may be provided, and an NMR gyroscope (or any other instrument/device) placed atop the inner base. Any desired electrical, mechanical, or other connections may be made with the NMR gyroscope. For example, a plurality of connection wires 130 could be fed through the inner shield apertures 112 and attached to the NMR gyroscope, then the inner shield apertures could be glassed in or otherwise filled to surround the connection wires, or vice versa, with the connection wires glassed in before connection to the NMR gyroscope. Next, the inner cover 110 is attached to the inner base 108 to substantially surround the NMR gyroscope with the inner shield 106, with the attachment being made via laser welding, chemical adhesion, mechanical engagement, friction/interference fit, or in any other manner. A vacuum may be provided within the inner shield 106.

The completed inner shield 106, with NMR gyroscope or other contents enclosed, is then placed upon the outer base 116 and any desired electrical, mechanical, or other connections may be made through the outer base 116 in much the same way as through the inner base 108. The inner shield 106 may be spaced apart from the outer base 116 or any other components of the outer shield 114 by one or more mounting blocks 122 or other structures. Once the connections have been made, the outer cover 118 is attached to the outer base 116 as described above, to form the outer shield 114. The intermediate volume 124 may be placed under vacuum, and/or a filling material of some sort may be placed therein, or may be left open to ambient air, once the outer shield 114 is assembled.

Alternately, the inner base 108, outer base 116, and mounting blocks 122 could first be assembled into the desired configuration, and then connection wires 130 could be secured in place. Next, the NMR gyroscope could be installed atop the inner base 108 and connected to the connection wires 130 for testing. The open inner and outer shields 106 and 114 in this assembly scheme might facilitate testing, adjustment, and/or repair of the NMR gyroscope, particularly if the components of the assembly 100 are very small. Once the NMR gyroscope is in a desired condition, then, the inner cover 110 and outer cover 118 may be attached to their respective inner and outer bases 108 and 116 to complete the assembly of the inner and outer shields 106 and 114.

Regardless of the order in which the above components are assembled, any additional outer shields (not shown) may then be placed around the assembled outer shield 114 in a similar manner. Once the desired number of shields surround the protected volume 104, the apparatus 100 is completed and ready for electrical, magnetic, mechanical, or any other connection to corresponding components of a larger system with which the apparatus is used.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. An apparatus configured for substantially obstructing at least one magnetic flux path between an ambient space and a protected volume, the protected volume being capable of containing a navigation grade nuclear magnetic resonance gyroscope, the apparatus comprising:
    an inner shield, having at least one inner shield aperture extending therethrough in order to allow external access to the protected volume, the inner shield completely three-dimensionally enclosing the protected volume, with the exception of the at least one inner shield aperture, in order to prevent passage of magnetic flux to the protected volume; and
    an outer shield having at least one outer shield aperture extending therethrough in order to allow internal access from the ambient space, the outer shield completely three-dimensionally enclosing the inner shield, with the exception of the at least one outer shield aperture, in order to prevent passage of magnetic flux to the protected volume;
    wherein the apparatus is configured to impede magnetic flux between at least one inner shield aperture and at least one outer shield aperture in order to protect the navigation grade nuclear magnetic resonance gyroscope, when located in the protected volume, from magnetic fields, such that an orthogonal external magnetic field penetrates the apparatus to reach the protected volume at less than five parts per million of an applied internal magnetic field within the protected volume.

2. The apparatus of claim 1, wherein the protected volume is partitioned into a plurality of protected subvolumes, a plurality of inner shields are provided, each of the inner shields substantially three-dimensionally encloses a protected subvolume in order to prevent passage of magnetic flux to the protected subvolume, and the plurality of inner shields are substantially three-dimensionally enclosed by the outer shield in order to prevent passage of magnetic flux to the protected subvolume.

3. The apparatus of claim 1, wherein a wiring board is located adjacent to and outside at least one of the inner and outer shields, and the wiring board is configured to provide an electrical connection to the protected volume while impeding magnetic flux between the ambient space and the protected volume in order to protect the navigation grade nuclear magnetic resonance gyroscope, when located in the protected volume, from magnetic fields.

4. The apparatus of claim 1, wherein at least one of the inner and outer shields is at least partially composed of an unoriented, 80% nickel-iron-molybdenum alloy.

5. The apparatus of claim 1, further comprising an intermediate volume substantially three-dimensionally surrounding the inner shield and substantially three-dimensionally enclosed by the outer shield in order to protect the navigation grade nuclear magnetic resonance gyroscope, when located in the protected volume, from magnetic fields.

6. The apparatus of claim 5, further comprising at least one mounting block located within the intermediate volume and spacing the inner shield apart from the outer shield, and wherein the mounting block is nonmagnetic.

7. The apparatus of claim 1, further comprising a second outer shield, substantially three-dimensionally enclosing the outer shield in order to protect the navigation grade nuclear magnetic resonance gyroscope, when located in the protected volume, from magnetic fields.

8. The apparatus of claim 1, wherein each inner shield aperture of the at least one inner shield aperture is arranged in an offset relationship with each outer shield aperture of the at least one outer shield aperture in order to prevent passage of magnetic flux to the protected volume.

9. The apparatus of claim 1, including a nonmagnetic material located within at least one of the inner and outer shield apertures in order to protect the navigation grade nuclear magnetic resonance gyroscope, when located in the protected volume, from magnetic fields.

10. An apparatus configured for substantially obstructing at least one magnetic flux path between an ambient space and a protected volume, the protected volume being capable of containing a navigation grade nuclear magnetic resonance gyroscope, the apparatus comprising:
an inner shield, substantially three-dimensionally enclosing the protected volume in order to prevent passage of magnetic flux to the protected volume;
an outer shield, substantially three-dimensionally enclosing the inner shield in order to prevent passage of magnetic flux to the protected volume; and
a wiring board located adjacent to and outside at least one of the inner and outer shielding means, wherein the wiring board is configured to provide an electrical connection to the protected volume while impeding magnetic flux between the ambient space and the protected volume in order to protect the navigation grade nuclear magnetic resonance gyroscope, when located in the protected volume, from magnetic fields, such that an orthogonal external magnetic field penetrates the apparatus to reach the protected volume at less than five parts per million of an applied internal magnetic field within the protected volume.

11. The apparatus of claim 10, wherein the protected volume is partitioned into a plurality of protected subvolumes, a plurality of inner shields are provided, each of the inner shields substantially three-dimensionally encloses a protected subvolume, at least one of the inner shields has an associated wiring board, and all of the inner shields are substantially three-dimensionally enclosed by the outer shielding means in order to prevent passage of magnetic flux to the plurality of protected subvolumes.

12. The apparatus of claim 10, wherein the wiring board impedes magnetic flux between at least one outer shield aperture and the ambient space in order to prevent passage of magnetic flux to the protected volume.

13. The apparatus of claim 12, further comprising a nonmagnetic material located within at least one of the inner and outer shield apertures in order to prevent passage of magnetic flux to the protected volume.

14. The apparatus of claim 12, further comprising an auxiliary layer at least partially enclosing the wiring board in a wiring space in cooperation with at least one of the inner and outer shields in order to prevent passage of magnetic flux to the protected volume.

15. A method of substantially obstructing at least one magnetic flux path between an ambient space and a protected volume, the protected volume being capable of containing a navigation grade nuclear magnetic resonance gyroscope, the method comprising:
substantially three-dimensionally enclosing the protected volume within an inner shield, the inner shield having at least one inner shield aperture extending therethrough in order to allow external access to the protected volume, in order to prevent passage of magnetic flux to the protected volume;
substantially three-dimensionally enclosing the inner shield within an outer shield, the outer shield having at least one outer shield aperture extending therethrough in order to allow internal access from the ambient space, in order to prevent passage of magnetic flux to the protected volume; and
impeding magnetic flux between at least one inner shield aperture and at least one outer shield aperture in order to protect the navigation grade nuclear magnetic resonance gyroscope, when located in the protected volume, from magnetic fields, such that an orthogonal external magnetic field reaches the protected volume at less than five parts per million of an applied internal magnetic field within the protected volume.

16. The method of claim 15, further comprising at least partially composing at least one of the inner and outer shields of an unoriented, 80% nickel-iron-molybdenum alloy.

17. The method of claim 15, further comprising:
substantially three-dimensionally surrounding the inner shield with an intermediate volume, in order to prevent passage of magnetic flux to the inner shield; and
substantially three-dimensionally surrounding the intermediate volume with the outer shield, in order to prevent passage of magnetic flux to the intermediate volume.

18. The method of claim 15, further comprising:
locating at least one nonmagnetic mounting block within the intermediate volume; and
spacing the inner shielding means apart from the outer shielding means with the mounting block.

19. The method of claim 15, further comprising substantially enclosing the outer shield with a second outer shield, in order to prevent passage of magnetic flux to the protected volume.

20. The method of claim 15, wherein the protected volume is partitioned into a plurality of protected subvolumes, and further comprising:
substantially three-dimensionally enclosing each of the protected subvolumes with at least one of a plurality of inner shielding means in order to prevent passage of magnetic flux to each of the protected subvolumes; and
substantially three-dimensionally enclosing all of the plurality of inner shielding means with the outer shielding means in order to prevent passage of magnetic flux to all of the protected subvolumes.

21. The method of claim 15, further comprising impeding magnetic flux between at least one inner shield aperture and at least one outer shield aperture, in order to prevent passage of magnetic flux to the protected volume.

22. The method of claim 21, further comprising arranging each inner shield aperture of the at least one inner shield aperture in an offset relationship with each outer shield aperture of the at least one outer shield aperture.

23. The method of claim 21, further comprising placing a nonmagnetic material at least partially within at least one of the inner and outer shield apertures, in order to prevent passage of magnetic flux to the protected volume.

24. The method of claim 15, further comprising placing a wiring board adjacent to and outside at least one of the inner and outer shielding means.

25. A system configured for substantially obstructing at least one magnetic flux path between an ambient space and a protected volume, the protected volume being capable of containing a navigation grade nuclear magnetic resonance gyroscope, the system comprising:
   an inner shielding means, substantially three-dimensionally enclosing the protected volume in order to prevent passage of magnetic flux to the protected volume, the inner shielding means having at least one inner shield aperture extending therethrough in order to allow external access to the protected volume;
   an outer shielding means, substantially three-dimensionally enclosing the inner shielding means in order to prevent passage of magnetic flux to the protected volume, the outer shielding means having at least one outer shield aperture extending therethrough in order to allow internal access from the ambient space; and
   obstruction means impeding magnetic flux between at least one inner shield aperture and at least one outer shield aperture in order to protect the navigation grade nuclear magnetic resonance gyroscope, when located in the protected volume, from magnetic fields, such that an orthogonal external magnetic field penetrates the apparatus to reach the protected volume at less than five parts per million of an applied internal magnetic field within the protected volume.

26. The system of claim 25, wherein the protected volume is partitioned into a plurality of protected subvolumes, a plurality of inner shielding means are provided, each of the inner shielding means substantially three-dimensionally encloses a protected subvolume, and all of the plurality of inner shielding means are substantially three-dimensionally enclosed by the outer shielding means in order to prevent passage of magnetic flux to each of the protected subvolumes.

27. The system of claim 25, wherein the obstruction means impedes magnetic flux between at least one inner shield aperture and at least one outer shield aperture, in order to prevent passage of magnetic flux to the protected volume.

28. The system of claim 25, wherein the obstruction means includes an arrangement of an inner shield aperture of the at least one inner shield aperture in an offset relationship with an outer shield aperture of the at least one outer shield aperture, in order to prevent passage of magnetic flux to the protected volume.

29. The system of claim 25, wherein the obstruction means includes a nonmagnetic material located within at least one inner shield aperture and at least one outer shield aperture, in order to prevent passage of magnetic flux to the protected volume.

30. The system of claim 25, wherein the obstruction means includes a wiring board adjacent to and outside at least one of the inner and outer shielding means.

* * * * *